United States Patent
Chou et al.

(10) Patent No.: US 10,049,890 B2
(45) Date of Patent: Aug. 14, 2018

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Chung-Yen Chou, Hsinchu (TW); Chih-Jen Chan, Changhua County (TW); Shih-Chang Liu, Kaohsiung County (TW); Chia-Shiung Tsai, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 155 days.

(21) Appl. No.: 15/261,393

(22) Filed: Sep. 9, 2016

(65) Prior Publication Data
US 2018/0076276 A1    Mar. 15, 2018

(51) Int. Cl.
*H01L 49/02* (2006.01)
*H01L 21/3205* (2006.01)

(52) U.S. Cl.
CPC ........ *H01L 21/32053* (2013.01); *H01L 28/75* (2013.01); *H01L 28/87* (2013.01)

(58) Field of Classification Search
CPC ... H01L 28/87; H01L 21/32053; H01L 28/40; H01L 28/90–28/92; H01L 29/66181; H01L 29/945
See application file for complete search history.

(56) References Cited

U.S. PATENT DOCUMENTS

| | | | | |
|---|---|---|---|---|
| 6,437,385 B1* | 8/2002 | Bertin | ............... | H01L 27/10861 257/301 |
| 9,178,080 B2* | 11/2015 | Kalnitsky | ............... | H01L 28/91 |
| 2006/0115952 A1* | 6/2006 | Wu | .................... | H01L 27/10855 438/386 |
| 2006/0255427 A1* | 11/2006 | Giraudin | ............. | H01L 27/0805 257/532 |
| 2007/0045693 A1* | 3/2007 | Manning | ........... | H01L 27/10852 257/296 |
| 2008/0291601 A1* | 11/2008 | Roozeboom | ............ | H01L 28/91 361/306.2 |

(Continued)

*Primary Examiner* — Daniel Luke
*Assistant Examiner* — Khatib Rahman
(74) *Attorney, Agent, or Firm* — WPAT, P.C., Intellectual Property Attorneys; Anthony King

(57) ABSTRACT

The present disclosure provides a semiconductor structure, comprising a substrate, dielectric layers and conductive layers. A first dielectric layer is disposed on a bottom surface and sidewall surfaces of a filled trench of the substrate. A first conductive layer is disposed on the first dielectric layer and has a first surface in the filled trench and a second surface above the substrate. A second dielectric layer is disposed on the first conductive layer. A second conductive layer is disposed on the second dielectric layer and has a first surface in the filled trench and a second surface above the substrate. A third dielectric layer is disposed on the second conductive layer. A third conductive layer is disposed in the filled trench and on the third dielectric layer. A top surface of the third conductive layer is lower than the second surface of the second conductive layer.

20 Claims, 4 Drawing Sheets

(56) References Cited

U.S. PATENT DOCUMENTS

| | | | |
|---|---|---|---|
| 2010/0244189 A1* | 9/2010 | Klootwijk | H01L 27/0805 257/532 |
| 2012/0211865 A1* | 8/2012 | Tian | H01L 27/0805 257/532 |
| 2013/0161792 A1* | 6/2013 | Tran | H01L 29/92 257/534 |
| 2013/0181326 A1* | 7/2013 | Cheng | H01L 21/32134 257/534 |
| 2015/0145103 A1* | 5/2015 | Chou | H01L 28/92 257/534 |

* cited by examiner

SEMICONDUCTOR STRUCTURE AND METHOD OF MANUFACTURING THE SAME

FIELD

The present disclosure relates generally to a semiconductor structure and a method of manufacturing a semiconductor structure, and more particularly, to a semiconductor structure having a deep trench capacitor and a method of manufacturing the same.

BACKGROUND

Capacitors are used for a myriad of purposes on modern integrated circuits. For example, decoupling capacitors are used to decouple one part of an electrical circuit, such as interconnect, from another part of the circuit. In such a configuration, noise arising from the interconnect can be shunted through a decoupling capacitor to reduce the effects of interconnect noise on the remainder of the circuit. Since such capacitors are often placed close to the circuit to eliminate parasitic inductances and resistances associated with the interconnect, there is a need to create a high density capacitor in either the IC technology of interest or in a stand alone process that results in an integrated capacitor device easily mountable on the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
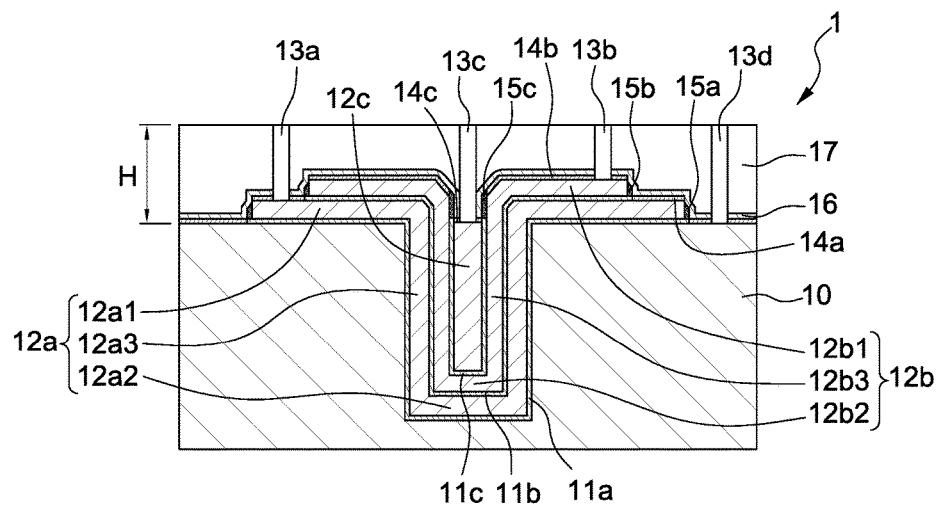
FIG. 1 is a cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1 is a cross-sectional view of a semiconductor structure 1 according to one or more embodiments of the present disclosure. In some embodiments, the semiconductor structure 1 may be a deep trench capacitor (DTC). The semiconductor structure 1 includes a substrate 10, a first dielectric layer 11a, a second dielectric layer 11b, a third dielectric layer 11c, a first conductive layer 12a, a second conductive layer 12b, a third conductive layer 12c, a first conductive interconnection 13a, a second conductive interconnection 13b, a third interconnection 13c, a fourth interconnection 13d, a first silicide 14a, a second silicide 14b, a third silicide 14c, a first spacer 15a, a second spacer 15b, a third spacer 15c, an etch stop layer 16 and an inter-level dielectric (ILD) 17.

In some embodiments, the substrate 10 includes a silicon carbide (SiC) substrate, sapphire substrate or a silicon substrate. The semiconductor structure 10 also includes a heterojunction formed between two different semiconductor material layers, such as material layers with different band gaps. For example, the semiconductor structure 10 includes a non-doped narrow-band gap channel layer and a wide-band gap n-type donor-supply layer. The substrate 10 has a trench that is filled by at least the first conductive layer 12a, the second conductive layer 12b and the third conductive layer 12c.

The first dielectric layer 11a is disposed on a bottom surface and sidewall surfaces of the trench and on a top surface of the substrate 10. In some embodiments, the first dielectric layer 11a is conformally formed on the bottom surface and sidewall surfaces of the trench. The first dielectric layer 11a may comprise molding compounds, pre-impregnated composite fibers (e.g., pre-preg) BPSG, silicon oxide, silicon nitride, silicon oxynitride, USG, any combination thereof, or the like. Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The first conductive layer 12a is disposed on the first dielectric layer 11a. In some embodiments, the first conductive layer 12a is conformally formed on the first dielectric layer 11a. The first conductive layer 12a has a first portion 12a1 above the top surface of the substrate, a second portion 12a2 above the bottom surface of the trench and a third portion 12a3 at sidewall surfaces of the trench. In some embodiments, the first conductive layer 12a is a polysilicon layer. In some embodiments, the first silicide 14a is disposed on parts of the first portion 12a1 of a top surface of the first conductive layer 12a. The first silicide 14a may comprise, for example, nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The first spacer 15a is disposed on the top surface of the substrate 10 and contacts to a sidewall surface of the first portion 12a1 of the first conductive layer 12a.

The second dielectric layer 11b is disposed on the first conductive layer 12a. In some embodiments, the second dielectric layer 11b is conformally formed on the first conductive layer 12a. In some embodiments, the second dielectric layer 11b and the first dielectric layer 11a comprise a same material. Alternatively, the second dielectric layer 11b and the first dielectric layer 11a comprise different materials.

The second conductive layer 12b is disposed on the second dielectric layer 11b. In some embodiments, the second conductive layer 12b is conformally formed on the second dielectric layer 11b. The second conductive layer 12b has a first portion 12b1 above the top surface of the substrate, a second portion 12b2 above the bottom surface of the trench and a third portion 12b3 at sidewall surfaces of the trench. In some embodiments, the second conductive layer 12b is a polysilicon layer. The second conductive layer 12b and the first conductive layer 12a are electrically isolated by the second dielectric layer 11b. In some embodiments, the second silicide 14b is disposed on parts of a top surface of the first portion 12b1 of the second conductive layer 12b. The second spacer 15b is disposed on the top surface of first portion 12a1 of the first conductive layer 12a and contacts to a sidewall surface of the first portion 12b1 of the second conductive layer 12b.

The third dielectric layer 11c is disposed on the second portion 12b2 and the third portion 12b3 of the second conductive layer 12b. In some embodiments, the third dielectric layer 11c and the first dielectric layer 11a comprise a same material. Alternatively, the third dielectric layer 11c and the first dielectric layer 11a comprise different materials.

The third conductive layer 12c is disposed in the trench and on the third dielectric layer 11c. In some embodiments, a top surface of the third conductive layer 12c is lower than a top surface of the first portion 12b1 of the second conductive layer 12b. In other words, a distance between the top surface of the third conductive layer 12c and the bottom surface of the trench is less than a distance between the top surface of the first portion 12b1 of the second conductive layer 12b and the bottom surface of the trench. In some embodiments, the top surface of the third conductive layer 12c is lower than a top surface of the first portion 12a1 of the first conductive layer 12a. In other words, a distance between the top surface of the third conductive layer 12c and the bottom surface of the trench is less than a distance between the top surface of the first portion 12a1 of the first conductive layer 12a and the bottom surface of the trench. In some embodiments, the top surface of the third conductive layer 12c is higher than a top surface of the substrate 10. In some embodiments, the third conductive layer 12c is a polysilicon layer. In some embodiments, a distance between the top surface of the third conductive layer 12c and the top surface of the first portion 12b1 of the second conductive layer 12b is less than approximately 4000 angstroms. The third conductive layer 12c and the second conductive layer 12b are electrically isolated by the third dielectric layer 11c. In some embodiments, the third silicide 14c is disposed the top surface of the third conductive layer 12c. The third spacer 15c is disposed on the top surface of the third conductive layer 12c and contacts to a sidewall surface of the second portion 12b2 of the second conductive layer 12b.

The etch stop layer 16 is disposed to cover the top surface of the substrate 10, the first, second and third silicide 14a, 14b, 14c and the first, second and third spacers 15a, 15b, 15c. The ILD 17 is disposed on the etch stop layer 16. In some embodiments, the ILD 17 has a maximum thickness H of approximately 9500 angstroms and a dielectric constant ranging from approximately 3.0 to approximately 8.5, although other thicknesses and dielectric constants could also be used.

The first conductive interconnection 13a penetrates the ILD 17 and the etch stop layer 16 to electrically contact with the first portion 12a1 of the first conductive layer 12a. The second conductive interconnection 13b penetrates the ILD 17 and the etch stop layer 16 to electrically contact with the first portion 12b1 of the second conductive layer 12b. The third conductive interconnection 13c penetrates the ILD 17 and the etch stop layer 16 to electrically contact with the third conductive layer 12c. The fourth conductive interconnection 13d penetrates the ILD 17 and the etch stop layer 16 to contact with the substrate 10. In some embodiments, the first, second, third and fourth interconnections 13a, 13b, 13c, 13d are conductive contacts or vias. In some embodiments, a length of the third conductive interconnection 13c is greater than the first conductive interconnection 13a. In some embodiments, a length of the third conductive interconnection 13c is greater than the second conductive interconnection 13b. In some embodiments, a length of the third conductive interconnection 13c is less than the fourth conductive interconnection 13d. In some embodiments, the first, second, third and fourth interconnections 13a, 13b, 13c, 13d may be individually or jointly connected to conductive material (not shown in FIG. 1) to form an electrode or electrodes of the deep trench capacitor.

Conventionally, the top surface of the third conductive layer is higher than the top surface of the first portion of the second conductive layer and the top surface of the first portion of the first conductive layer. In the conventional setting, an ILD about or greater than 13000 angstroms is needed. In the semiconductor structure 1 as shown in FIG. 1, by lowering the top surface of the third conductive layer 12c to be lower than the top surface of the first portion 12b1 of the second conductive layer 12b and the top surface of the first portion 12a1 of the first conductive layer 12a, the maximum thickness H of the ILD 17, for example, a thickness measured from a top surface of the ILD 17 to the substrate 10, can be decreased, which would in turn to reduce the total thickness of the semiconductor structure 1 and the manufacturing cost. In addition, due to the limitation of the process, it is difficult to form a trench with high aspect ratio into the ILD to form conductive contacts. Therefore, by reducing the maximum thickness H of the ILD 17, it is easier to etch the ILD 17 to form conductive contacts as opposed to etch a thicker ILD provided in the conventional setting. In some embodiments, the maximum thickness H of the ILD 17 described herein can be reduced to 9500 angstroms.

FIG. 2A to FIG. 2F are cross-sectional views of a semiconductor structure fabricated at various stages, in accordance with some embodiments of the present disclosure. Various figures have been simplified for a better understanding of the inventive concepts of the present disclosure.

Figure 2A:
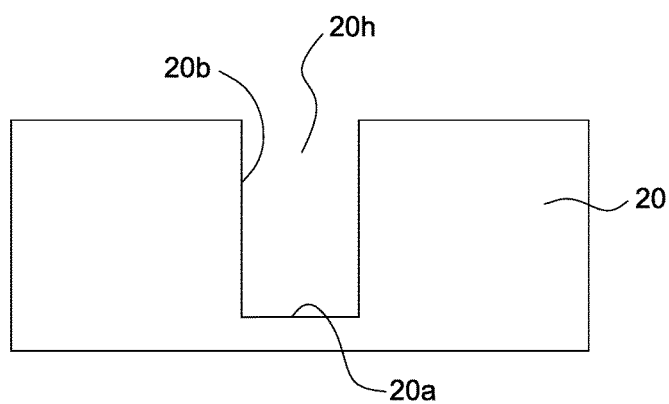
FIGS. 2A-2F are a series of cross-sectional views illustrating processing steps to fabricate the semiconductor structure, in accordance with some embodiments of the present disclosure.

Referring to FIG. 2A, a substrate 20 is provided. The substrate 20 includes a silicon carbide (SiC) substrate, sapphire substrate or a silicon substrate. The semiconductor structure 20 also includes a heterojunction formed between two different semiconductor material layers, such as material layers with different band gaps. For example, the semiconductor structure 20 includes a non-doped narrow-band gap channel layer and a wide-band gap n-type donor-supply layer.

A trench 20h is formed from a top surface of the substrate 20 into the substrate 20. The trench 20h can be formed by using, for example, drilling, laser drilling, etching or other suitable operations. The trench 20h has a bottom surface 20a and sidewall surfaces 20b.

Figure 2B:
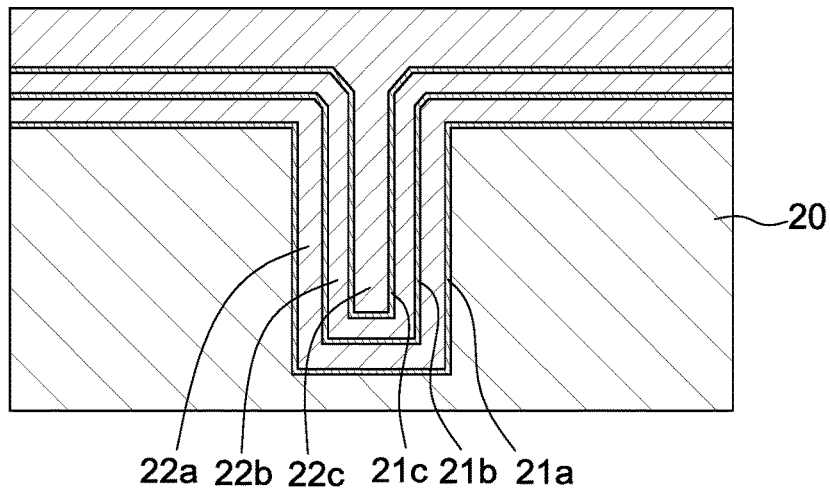

Referring to FIG. 2B, a first dielectric layer 21a is formed on a bottom surface and sidewall surfaces of the trench 20h and on a top surface of the substrate 20. In some embodiments, the first dielectric layer 21a is conformally formed on the bottom surface and sidewall surfaces of the trench and the top surface of the substrate 20. The first dielectric layer 21a may comprise molding compounds, pre-impregnated composite fibers (e.g., pre-preg) BPSG, silicon oxide, silicon nitride, silicon oxynitride, USG, any combination thereof, or the like. Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The first conductive layer 22a is formed on the first dielectric layer 21a. In some embodiments, the first conductive layer 22a is conformally formed on the first dielectric layer 21a. The first conductive layer 22a has a first portion above the top surface of the substrate 20, a second portion above the bottom surface of the trench and a third portion at sidewall surfaces of the trench. In some embodiments, the first conductive layer 22a is a polysilicon layer.

The second dielectric layer 21b is formed on the first conductive layer 22a. In some embodiments, the second dielectric layer 21b is conformally formed on the first conductive layer 22a. In some embodiments, the second dielectric layer 21b and the first dielectric layer 21a comprise a same material. Alternatively, the second dielectric layer 21b and the first dielectric layer 21a comprise different materials.

The second conductive layer 22b is formed on the second dielectric layer 21b. In some embodiments, the second conductive layer 22b is conformally formed on the second dielectric layer 21b. The second conductive layer 22b has a first portion above the top surface of the substrate 20, a second portion above the bottom surface of the trench and a third portion at sidewall surfaces of the trench. In some embodiments, the second conductive layer 22b is a polysilicon layer. The second conductive layer 22b and the first conductive layer 22a are electrically isolated by the second dielectric layer 21b.

The third dielectric layer 21c is formed on the second conductive layer 22b. In some embodiments, the third dielectric layer 21c is conformally formed on the second conductive layer 22b. In some embodiments, the third dielectric layer 21c and the first dielectric layer 21a comprise a same material. Alternatively, the third dielectric layer 21c and the first dielectric layer 21a comprise different materials.

The third conductive layer 22c is formed on the second dielectric layer 21b. The third conductive layer 22c has a first portion above the top surface of the substrate 20 and a second portion filled within the trench. In some embodiments, the third conductive layer 22c is a polysilicon layer. The third conductive layer 22c and the second conductive layer 22b are electrically isolated by the third dielectric layer 21c.

Figure 2C:
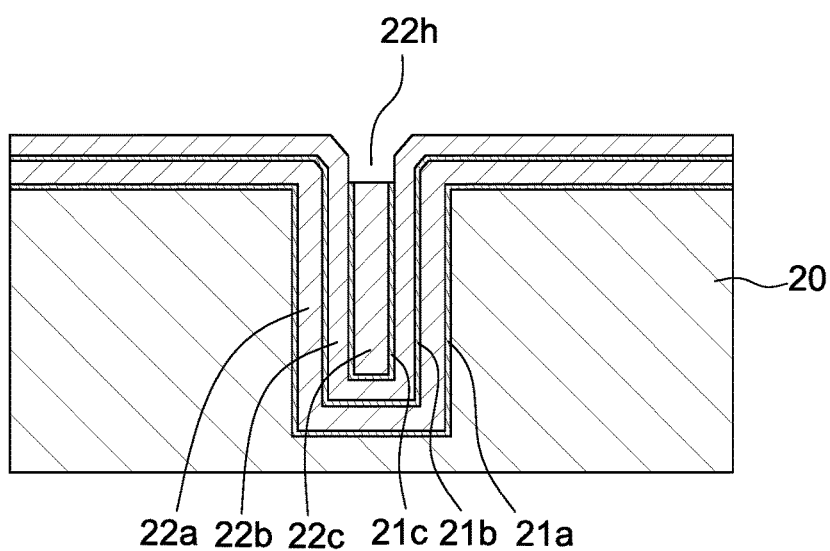

Referring to FIG. 2C, a blanket etch is carried out to remove the first portion and parts of the second portion of the third conductive layer 22c. Alternatively stated, a recess 22h is formed below the first portion of the second conductive layer 22b. As shown in FIG. 2C, after the etch operation, a top surface of the third conductive layer 22c is lower than a top surface of the first portion of the second conductive layer 22b and a top surface of the first portion of the first conductive layer 22a. In some embodiments, the etched surface of the third conductive layer 22c is not flat as shown in FIG. 2C. For example, a dimple (not shown) can be observed on top surface of the third conductive layer 22c.

The depth of the recess 22h is determined to be in a range in order to fulfill intended purpose. For example, the recess cannot be deeper than a total thickness of the sum of the first portion of the second conductive layer 22b and the first portion of the first conductive layer 22a, otherwise the recess becomes the limiting highest aspect ratio trench structure in the semiconductor structure. For another example, the recess cannot be zero, i.e., coplanar with the first portion of the second conductive layer 22b, because an isolation between the first conductive layer 22a and the second conductive layer 22b shall be enhanced by further depositing a spacer over the third conductive layer 22c and contacting a third portion of the second conductive layer 22b. The spacer deposition for isolation enhancement is further discussed in FIG. 2E of the present disclosure. Hence, it is determined that the recess to have a bottom situated coelevational to a horizontal surface above the top surface of the substrate 20 and below the first portion of the second conductive layer 22b. In some embodiments, a distance between the top surface of the third conductive layer 22c and the top surface of the first portion of the second conductive layer 22b is less than approximately 4000 angstroms. In some embodiments, the top surface of the third conductive layer 22c is higher than the top surface of the substrate 20.

Figure 2D:
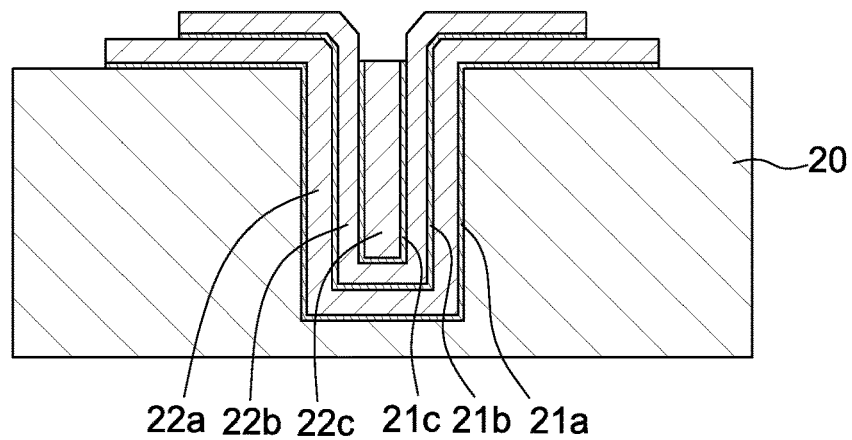

Referring to FIG. 2D, an etch is carried out to remove parts of the first portion of the first conductive layer 22a and the first portion of the second conductive layer 22c. As shown in FIG. 2D, after the etch operation, the top surface of the substrate 20, the top surface of the first portion of the first conductive layer 22a and the top surface of the first portion of the second conductive layer 22b are arranged stepwise.

Figure 2E:
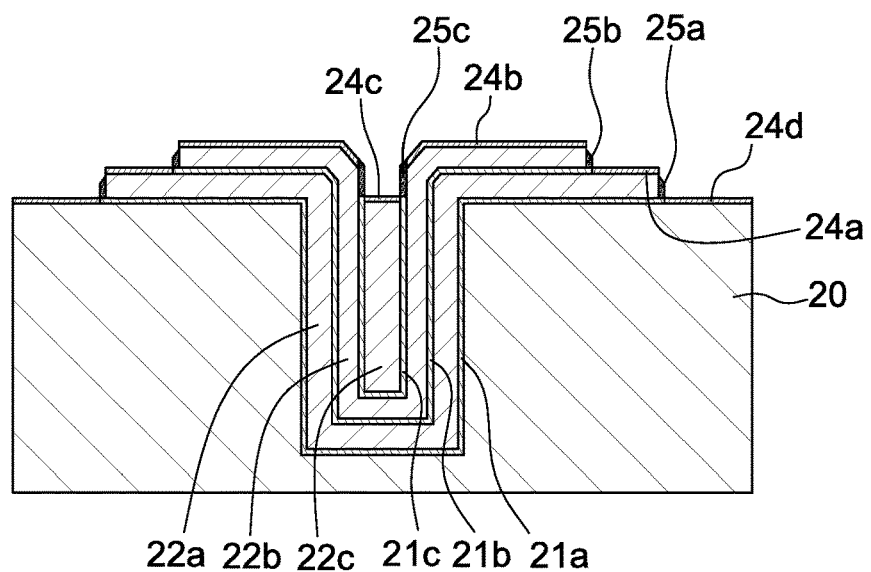

Referring to FIG. 2E, a first silicide 24a is formed on the top surface of the first portion of the first conductive layer 22a that is not covered by the second conductive layer 22b. A second silicide 24b is formed on the top surface of the first portion of the second conductive layer 22b. The third silicide 24c is formed on the top surface of the third conductive layer 22c. The fourth silicide 24d is formed on the top surface of the substrate 20 that is not covered by the first conductive layer 22a. The first, second, third and fourth silicide 24a, 24b, 24c, 24d may comprise nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi) and/or combinations thereof. In an example, the first, second, third and fourth silicide 24a, 24b, 24c, 24d are formed by a salicide (self-aligned silicide) operation.

A first spacer 25a is formed over the substrate 20 and contacts to a sidewall surface of the first portion of the first conductive layer 22a. A second spacer 25b is formed over the first portion of the first conductive layer 22a and contacts to a sidewall surface of the first portion of the second conductive layer 22b. The second spacer 25c is formed over the third conductive layer 22c and contacts to the sidewall surface of the third portion of the second conductive layer 22b. The first, second and third spacers 25a, 25b, 25c may comprise SiN.

Figure 2F:
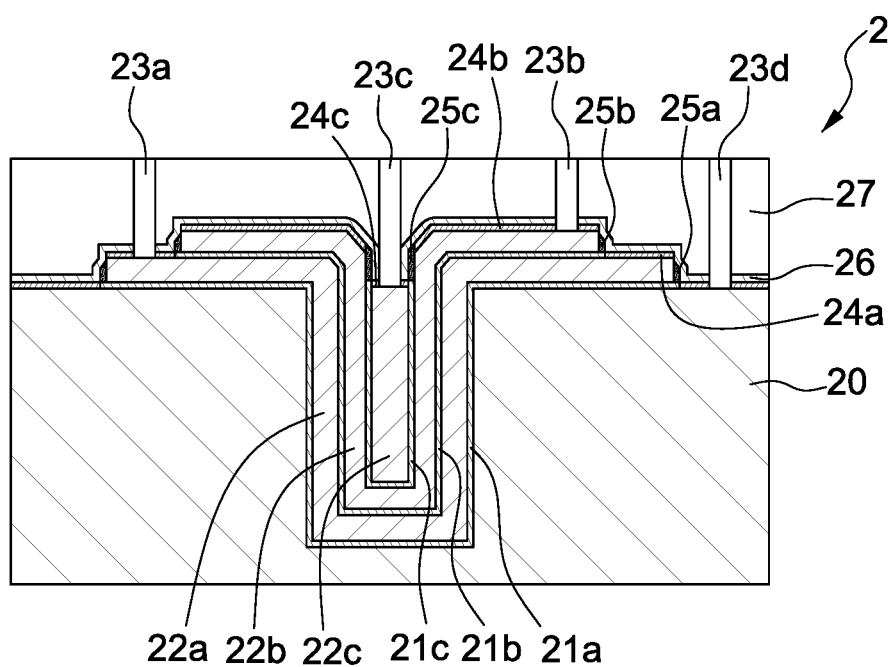

Referring to FIG. 2F, an etch stop layer 26 is formed to cover the top surface of the substrate 20, the first, second, third and fourth silicide 24a, 24b, 24c, 24d and the first, second and third spacers 25a, 25b, 25c.

An ILD 27 is formed on the etch stop layer 26. In some embodiments, the ILD 27 has a maximum thickness H of approximately 9500 angstroms and a dielectric constant ranging from approximately 3.0 to approximately 8.5, although other thicknesses and dielectric constants could also be used.

A plurality of trenches are formed to penetrate the ILD 27 to respectively expose the first, second, third and fourth silicide 24a, 24b, 24c, 24d. The trenches can be formed by using, for example, drilling, laser drilling, etching or other suitable operations.

A first conductive interconnection 23a, a second conductive interconnection 23b, a third conductive interconnection 23c and a fourth conductive interconnection 23d are formed in the respective trenches to electrically contact with the first silicide 24a, the second silicide 24b, the third silicide 24c and the fourth silicide. In some embodiments, the first, second, third and fourth interconnections 23a, 23b, 23c, 23d are conductive contacts or vias. In some embodiments, a length of the third conductive interconnection 23c is greater than the first conductive interconnection 23a. In some embodiments, a length of the third conductive interconnection 23c is greater than the second conductive interconnection 23b. In some embodiments, a length of the third conductive interconnection 23c is less than the fourth conductive interconnection 23d. In some embodiments, the first, second, third and fourth interconnections 23a, 23b, 23c, 23d may be individually or jointly connected to conductive material (not shown in the drawings) to form an electrode or electrodes of the deep trench capacitor.

As mentioned above, by lowering the top surface of the third conductive layer 22c to be lower than the top surface of the first portion of the second conductive layer 22b and the top surface of the first portion of the first conductive layer 22a, the maximum thickness H of the ILD 27, for example, a thickness measured from a top surface of the ILD 27 to the substrate 2, can be decreased, which would in turn to reduce the total thickness of the semiconductor structure 1 and the manufacturing cost. In addition, by reducing the maximum thickness H of the ILD 27, it is easier to etch the ILD 27 to form conductive contacts as opposed to etch a thicker ILD provided in the conventional setting. Furthermore, during the etch operation in FIG. 2C, the first portion and a part of the second portion of the third conductive layer are to be removed by a blanket etch, it is unnecessary to use an additional photomask for patterning the third conductive layer. Therefore, it can simplify manufacturing operations and reduce the manufacturing cost.

The scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such as processes, machines, manufacture, compositions of matter, means, methods or steps/operations. In addition, each claim constitutes a separate embodiment, and the combination of various claims and embodiments are within the scope of the disclosure.

What is claimed is:

1. A semiconductor structure, comprising:
a substrate having a filled trench;
a first dielectric layer disposed on a bottom surface and sidewall surfaces of the filled trench and on the substrate;
a first conductive layer disposed on the first dielectric layer, the first conductive layer having a first surface in the filled trench and a second surface above the substrate;
a second dielectric layer disposed on the first conductive layer;
a second conductive layer disposed on the second dielectric layer, the second conductive layer having a first surface in the filled trench and a second surface above the substrate;
a third dielectric layer disposed on the second conductive layer; and
a third conductive layer disposed in the filled trench and on the third dielectric layer,
wherein a top surface of the third conductive layer is lower than the second surface of the second conductive layer.

2. The semiconductor structure of claim 1, wherein the top surface of the third conductive layer is lower than the second surface of the first conductive layer.

3. The semiconductor structure of claim 1, wherein the top surface of the third conductive layer is higher than a top surface of the substrate.

4. The semiconductor structure of claim 1, further comprising:
a first conductive contact electrically connected to the second surface of the first conductive layer;
a second conductive contact electrically connected to the second surface of the second conductive layer; and
a third conductive contact electrically connected to the top surface of the third conductive layer.

5. The semiconductor structure of claim 4, wherein a length of the third conductive contact is longer than a length of the second conductive contact.

6. The semiconductor structure of claim 4, wherein a length of the third conductive contact is longer than a length of the first conductive contact.

7. The semiconductor structure of claim 1, wherein the first conductive layer, the second conductive layer and the third conductive layer comprise polysilicon.

8. The semiconductor structure of claim 1, further comprising:
a first silicide disposed on the second surface of the first conductive layer;
a second silicide disposed on the second surface of the second conductive layer; and
a third silicide disposed on the top surface of the third conductive layer.

9. The semiconductor structure of claim 1, further comprising:
a first spacer above the substrate and contacting to a sidewall surface of the first conductive layer;
a second spacer above the first conductive layer and contacting to a sidewall surface of the second conductive layer; and a third spacer above the top surface of the third conductive layer and contacting to the second conductive layer.

10. The semiconductor structure of claim 1, further comprising an etch stop layer covering the substrate, the second surface of the first conductive layer, the second surface of the second conductive layer and the top surface of the third layer.

11. A capacitor structure, comprising:
a substrate having a top surface and a bottom surface opposite to the top surface, the substrate having a first filled trench;
a first polysilicon disposed in the first trench and above the top surface of the substrate, the first polysilicon having a second filled trench;
a second polysilicon disposed in the second filled trench and above the first polysilicon, the second polysilicon having a third filled trench and being electrically isolated from the first polysilicon;
a third polysilicon disposed in the third filled trench, the third polysilicon being electrically isolated from the second polysilicon;
wherein a distance from a top surface of the third polysilicon to the bottom surface of the substrate is less than a distance from a top surface of the second polysilicon to the bottom surface of the substrate.

12. The capacitor structure of claim 11, wherein the distance from the top surface of the third polysilicon to the bottom surface of the substrate is less than a distance from a top surface of the first polysilicon to the bottom surface of the substrate.

13. The capacitor structure of claim 11, wherein the distance from the top surface of the third polysilicon to the bottom surface of the substrate is greater than the thickness of the substrate.

14. The capacitor structure of claim 11, further comprising
a first dielectric layer disposed between the substrate and the first polysilicon;
a second dielectric layer disposed between the first polysilicon and the second polysilicon; and
a third dielectric layer disposed between the second polysilicon and the third polysilicon.

15. The capacitor structure of claim 11, further comprising:
a first conductive contact electrically connected to a top surface of the first polysilicon;
a second conductive contact electrically connected to the top surface of the second polysilicon; and
a third conductive contact electrically connected to the top surface of the third polysilicon.

16. The capacitor structure of claim 11, further comprising:
a first silicide disposed on a top surface of the first polysilicon;
a second silicide disposed on the top surface of the second polysilicon; and
a third silicide disposed on the top surface of the third polysilicon.

17. The capacitor structure of claim 11, further comprising:
a first spacer above the substrate and contacting to a sidewall surface of the first conductive layer;
a second spacer above the first conductive layer and contacting to a sidewall surface of the second conductive layer; and
a third spacer above the top surface of the third conductive layer and contacting to the second conductive layer.

18. A method of manufacturing a semiconductor structure, comprising:
(a) proving a substrate having a top surface;
(b) forming a trench from the top surface of the substrate into the substrate;
(c) disposing a first dielectric layer on a bottom surface and sidewall surfaces of the trench and on the substrate;
(d) disposing a first conductive layer on the first dielectric layer, the first conductive layer having a first surface in the trench and a second surface above the substrate;
(e) disposing a second dielectric layer on the first conductive layer;
(f) disposing a second conductive layer on the second dielectric layer, the second conductive layer having a first surface in the trench and a second surface above the substrate;
(g) disposing a third dielectric layer on the second conductive layer; and
(h) disposing a third conductive layer in the trench and on the third dielectric layer, wherein a top surface of the third conductive layer is lower than a second surface of the second conductive layer.

19. The method of claim 18, wherein the top surface of the third conductive layer is lower than the second surface of the first conductive layer.

20. The method of claim 18, wherein the top surface of the third conductive layer is higher than the top surface of the substrate.

* * * * *